United States Patent
Ruell et al.

[11] 3,947,640
[45] Mar. 30, 1976

[54] METHOD AND DEVICE FOR RECORDING DATA AS HOLOGRAMS IN A MULTI-CHANNEL STORAGE TAPE

[75] Inventors: Hartwig Ruell, Otterfing; Dietlind Pekau, Krailling; Hans Eschler, Munich, all of Germany

[73] Assignee: Siemens Aktiengesellschaft, Berlin & Munich, Germany

[22] Filed: Nov. 6, 1974

[21] Appl. No.: 521,386

Related U.S. Application Data

[63] Continuation of Ser. No. 322,356, Jan. 10, 1973, abandoned.

[30] Foreign Application Priority Data

Jan. 24, 1972  Germany............................ 2203246

[52] U.S. Cl..... 179/100.3 B; 179/100.3 G; 350/3.5; 346/108
[51] Int. Cl.² ....................... G11B 7/00; H04N 5/84
[58] Field of Search ....................... 179/100.3 G, 100.3 B, 100.3 F; 350/3.5; 178/6.7 A; 346/107, 108; 340/173 LM

*Primary Examiner*—Terrell W. Fears
*Assistant Examiner*—David K. Moore
*Attorney, Agent, or Firm*—Hill, Gross, Simpson, Van Santen, Steadman, Chiara & Simpson

[57] ABSTRACT

A method and apparatus for recording data in parallel extending information channels or tracks on a storage tape characterized by the object beam and reference beam being commonly and sequentially deflected in a direction perpendicular to the parallel information tracks or channels. The invention is also directed to a method of retrieving or reading-out the information which includes focusing a retrieval beam on the tracks with a cylindrical lens to either simultaneously illuminate each of the tracks and sequentially detect the information contained in the individual tracks or deflecting the focused beam sequentially in a vertical direction from track to track for sequentially retrieving the information recorded thereon.

1 Claim, 4 Drawing Figures

METHOD AND DEVICE FOR RECORDING DATA AS HOLOGRAMS IN A MULTI-CHANNEL STORAGE TAPE

This is a continuation of application Ser. No. 322,356 filed Jan. 10, 1973 and now abandoned.

BACKGROUND OF THE INVENTION

1. Field of the Invention:

The present invention is directed to a method and device for sequentially recording holograms containing analogue or digital data into parallel extending tracks on a storage tape and to a method of retrieving the information.

2. Prior Art:

Presently known approaches for sequential optical data storage arrange for a time-variable signal to be modulated onto a laser beam by pulse amplitude modulation to provide an object beam is directed on a photo sensitive storage medium along with a constant (in time) coherent reference wave to produce interference patterns which are recorded as unidimensional or onedimensional holograms on the moving tape.

Each modulated pulse corresponds to a hologram whose contrast is a measure of the amplitude of the corresponding modulated pulse.

Another approach, which is disclosed in U.S. Pat. application Ser. No. 290,796 which was filed on Sept. 21, 1972, and which issued as U.S. Pat. No. 3,805,275 on Apr. 16, 1974, utilized noncoherent light for sequential optical data storage. In this approach, a pulse amplitude modulated light beam is utilized to form unidimensional or onedimensional holograms in several parallel tracks on a storage tape, However, in this approach, a corrective illumination beam, which is physically and chronologically separate, must be used to insure that the overall illumination of the storage tape remains constant with each recording.

Between the incidence of two successive light pulses, the storage medium moves onward by a distance or interval $\Delta x$. The magnitude of this interval $\Delta x$ depends upon the tape feed speed which in turn depends upon the band width of the signal being recorded. While it is desirable to store the individual holograms as close together as possible for example to arrange for the interval $\Delta x$ to be at a minimum, the magnitude of the interval $\Delta x$ cannot be made arbitrarily small.

SUMMARY OF THE INVENTION

The present invention is directed to a method and device for recording holograms containing data on a storage tape in which either the tape feed speed as well as access time can be reduced or the signal to noise ratio can be improved while leaving the tape feed speed unaffected. To accomplish this, the object beam and the reference beam are directed commonly by a deflecting device sequentially in a direction extending perpendicular to the tape feed direction to sequentially project the beams onto individual tracks or channels of the storage tape. By utilizing a plurality of parallel tracks or channels, a higher storage density is obtained and the mean access time is reduced in accordance with the number of parallel tracks and is lower than the values obtainable with magnetic tape storage. Preferably, the object beam, which is preferably a pulse-amplitude modulated laser beam and the reference beams are focused by cylindrical lens so that unidimensional holograms are recorded. To aid in recording and in retrieving the information, additional information such as a synchronization signal may be recorded for each vertical recording cycle. To retrieve the information from the channels on the tape, the invention also is directed to a method in which a beam is focused by a cylindrical lens to be either simultaneously projected onto all of the channels or sequentially projected by a deflecting means.

DESCRIPTION OF THE PREFERRED EMBODIMENTS

Figure 1:
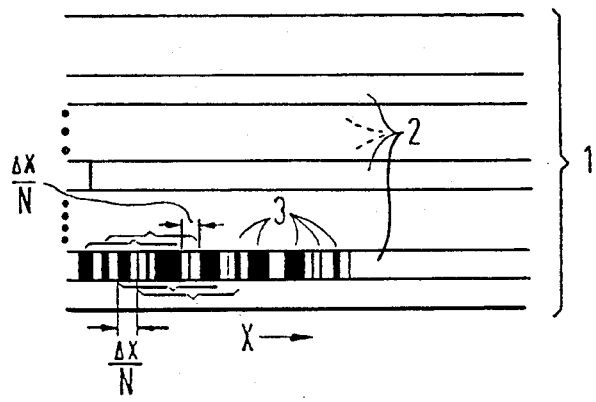
FIG. 1 illustrates an arrangement of holograms in individual parallel tracks or channels of a storage tape.

The principles of the present invention are particularly useful in producing a storage tape 1 which has a plurality parallel tracks or channels 2 of which three are shown. The tape 1 during recording and read-out is moved in a direction indicated by the arrow X and the channels or tracks 2 extend parallel to this direction. The data to be recorded is recorded as individual holograms 3 in the parallel channels or tracks 2.

By sequentially recording the individual holograms 3 in the parallel tracks 2, the speed of the moving tape 1 can be chosen so that after the end of a vertical recording cycle, which is the recording of data extending in a row substantially perpendicular to the tracks 2, the tape is advanced by an interval $\Delta x$. When compared with a single track recording, the multitrack recording can produce the same spacing between adjacent holograms 3 in the same track 2 with a reduction in the tape speed during recording and reproduction by a factor of 1/N, where N is the number of parallel tracks or channels 2. Thus the required tape speed to produce a given spacing between holograms in each channel 2 of the storage tape 1 is $\Delta x/N$ as compared to a tape speed of $\Delta x$ for a single track or channel storage tape. At the same time the number of bits of data being stored per centimeter of tape is increased by the factor N.

Figure 2:
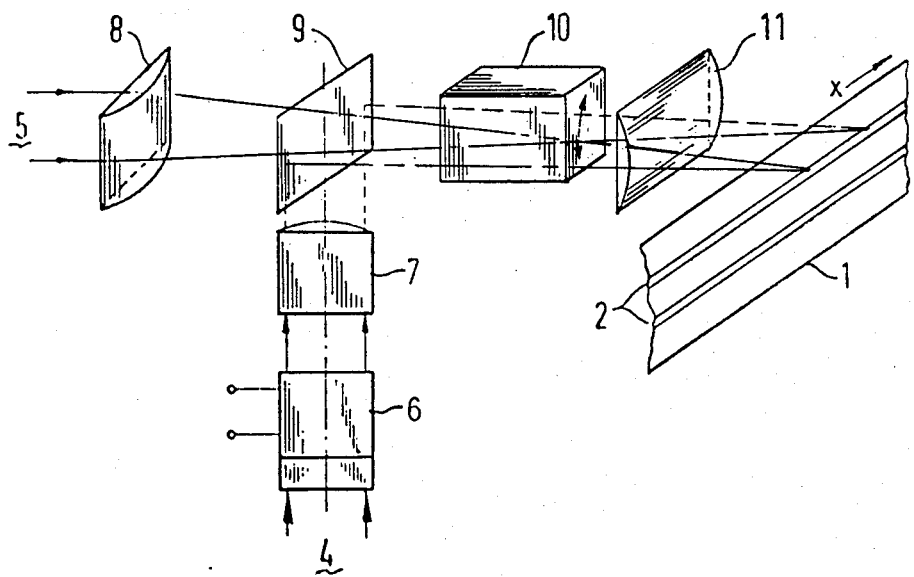
FIG. 2 is a schematic illustration of a device for recording data in a plurality of parallel tracks or channels of a storage medium.

The record the holograms 3 sequentially in one track after the other track on the tape 1, a device schematically illustrated in FIG. 2 is utilized to perform the method. An object beam 4 of coherent radiation is passed through a modulator 6 which has leads for receiving a signal or information which is to be modulated onto the object beam. The modulated object beam which contains modulated pulses is then focused by a cylindrical lens 7 onto a beam splitter 9. At the same time, a reference beam 5 of coherent radiation is focused by a cylindrical lens 8 to pass through the beam splitter 9. The beam splitter 9 may be a partially translucent mirror which passes the reference beam 5 while relfecting the object beam 4. The two beams 4 and 5 are directed from the beam splitter through a deflecting means illustrated as a deflecting unit 10 which directs the beams 4 and 5 sequentially onto the individual tracks 2 of the storage tape 1. The deflecting unit 10 deflects the beams 4 and 5 in a direction extending perpendicular to the tape feed direction X so that the holograms 3 are recorded sequentially in one track after another along a line extending substantially perpendicular to the direction X. The deflecting unit 10 may be a high speed optical deflecting system such as an acusto-optical or an electro-optical deflecting device.

In order to avoid distorsion of the wave fields being deflected by the electro-optical or acousto-optical deflector of the deflecting unit 10, object and reference waves with a cylindrical geometry are used. To obtain the cylindrical geometry, the cylindrical lenses 7 and 8 and a third cylindrical lens 11 are provided. The cylindrical axis of the lenses 7 and 8 are arranged parallel to the deflection direction and this in turn extends perpendicular to the tape feed directon X. The cylindrical lens 11 is located between the deflection unit 10 and the storage tape 1 and has its axis extending parallel to the tape feed direction X so that the lens 11 may focus the deflected object and reference waves onto the tape 1 to form unidimensional or one-dimensional holograms. As illustrated, the deflecting unit 10 commonly deflects both the object and reference beams in a direction extending perpendicular to the tape direction X so that the beams 4 and 5 are sequentially projected on each of the tracks or channels 2.

The storage medium can be a normal holographic material. Erasable optical recording materials can also be used as well as heat sensitive thermo plastics which will record surface relief holograms.

Figure 3:
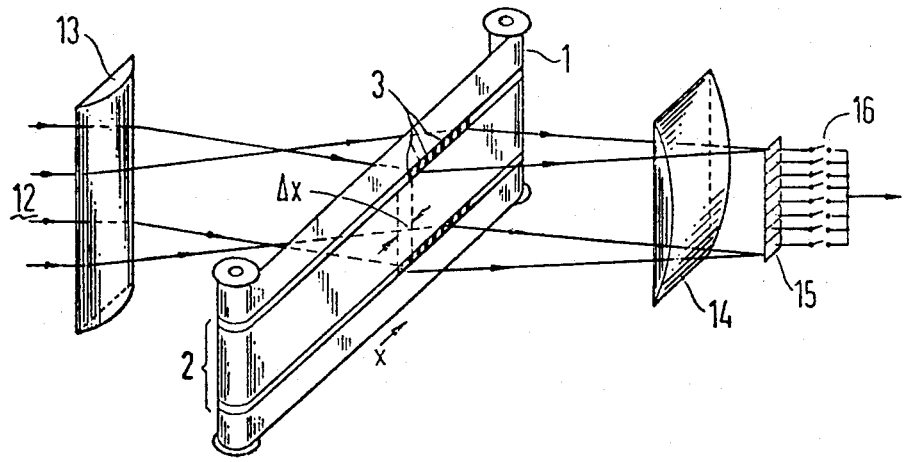
FIG. 3 is a schematic illustration of a first device for reading-out the data stored in a plurality of tracks.

To retrieve the information, a read-out or retrievel device such as schematically illustrated in FIG. 3 can be utilized. In this device, a storage tape 1 is passed before a light beam 12 which carries out the reconstruction of the signal stored in the form of parallel unidimensional holograms 3. The information contained in the holograms is detected by a photo detector system or unit such as 15. In the first preferred embodiment, the light beam 12 is focused by a cylindrical lens 13 to simultaneously illuminate all of the tracks or channels 2. The photo detector system 15 is located in the reconstruction plane of the holograms 3, and has a plurality of individual detector elements with one element associated with each track or channel 2. The individual reconstructed images of the holograms are focused by a cylindrical lens 14 onto the elements of the detector 15. The photo detector system includes an electronic scanning switch 16 to sequentially scan the signals appearing on the individual detector elements.

Figure 4:
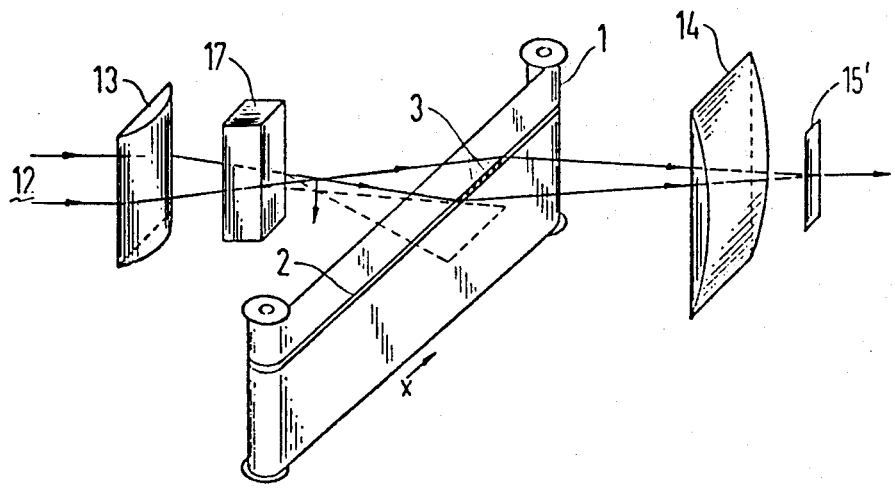
FIG. 4 is a schematic illustration of a second device for reading-out information stored in a plurality of tracks on a storage medium.

A second preferred embodiment of a read-out or retrieval system is illustrated in FIG. 4. A light beam 12, for example a laser beam, is focused by a cylindrical lens 13 and is received by a light deflecting means 17 which sequentially deflects the beam in a direction perpendicular to the tape direction and sequentially directs the beam upon each of the holograms contained in the individual channels or tracks 2. As the deflected beam moves from track to track to sequentially illuminate the holograms, images are sequentially reconstructed. The reconstructed images are focused by a cylindrical mirror 14 on a photo detector 15' which is located in the reconstruction plane for the hologram. The photo detector 15' is a slot-like detector whose width is selected in accordance with the resolution of the hologram 3.

In order to achieve an optimum reproduction speed, a divergent reference wave and a convergent object wave will be used. To optimize the signal to noise ratio and the resolution, the wave front of the read-out light beam, in the tape feed direction, must correspond with that of the reference beam at the time of recording.

When using the proposed multi-channel storage technique for storing either audio or video data and also for storing digital data, it is desirable to synchronize the recording and read-out process. To accomplish this synchronization, a synchronizing signal is superimposed upon the signal being recorded. The synchronizing signal, which will be recorded in the first track during a recording process, triggers the vertical light deflection from track to track during recording. Thus one synchronizing pulse is recorded for each vertical recording cycle which is a complete scan in the vertical direction of the tracks or channels 2 of the tape. During read-out with the photo detector, the signal recorded in the first track triggers a vertical scanning function of the light deflector. When storing video signals, this deflection frequency is made equal to the recording deflection frequency.

If it is necessary to be able to arbitrarily address the individual tracks of stored bits of information, the position of the tape parallel to the tape feed direction is determined by means of a counter which receives the synchronization signal. On reaching the desired horizontal position, the vertical deflection function is triggered and once again the number of tracks is determined by using the counter. The amplitude of the synchronization pulse can be used to monitor slight positional fluctuations on the part of the storage medium in a direction extending perpendicular to the tape feed direction.

In comparison with the single track recording, the access time with a multi-track or channel recording is reduced in accordance with the number of parallel tracks or channels present on the storage tape 1. The synchronization pulse train, which is recorded in the first track with a pulse for each vertical cycle, is exploited for a rapid location of data. By counting each of the recorded synchronization signals or pulses with an electronic counter during a search phase, the tape can be stopped at the desired position to retrieve individual bits of data. The essential thing is that the tape speed need not be uniform during the search phase. Ultimately the access time is limited by the maximum tape speed which is technically possible. However, because of the high storage density, the mean access time is shorter than with magnetic tape storage.

By relinquishing the maximum possible storage density and by increasing the interval between adjacent holograms in the same track so that the image produced by the individual holograms at the time of reproduction are not so close together, the signal to noise ratio may be correspondingly improved. The individual reconstructed images can be sharply separated in this situation and are easier to read-out or retrieve. Furthermore, this reduces the probability of cross talk due to overlapping of neighboring images.

Although minor modifications may be suggested by those versed in the art, it should be understood that we wish to employ within the scope of the patent granted hereon, all such modifications that reasonably and properly come within the scope of our contribution to the art.

We claim:

1. A method of recording a plurality of one-dimensional holograms containing analog or digital data sequentially in multi-channels on a storage tape comprising providing a tape having a plurality of parallel channels extending along a tape direction; moving the tape in the tape direction; pulse amplitude modulating a laser beam to produce an object beam having a plurality of modulated pulses with each modulated pulse containing a signal to be recorded; providing a reference beam; combining the object beam and reference beam into a commonly directed beam by focusing one of the beams with a cylindrical lens through a beam splitting device and by focusing the other of the two beams with a second cylindrical lens at the beam splitting device; directing the combined object beam and reference beam through a beam deflecting means and focusing the beams with a third cylindrical lens onto the storage tape; sequentially deflecting both the object beam and the reference beam consecutively on the channels of the storage tape with the direction of deflection extending perpendicular to the tape direction to produce a recording cycle extending transversely across the channel to record one-dimensional holograms in each of the channels sequentially wherein each one-dimensional hologram corresponds to each modulated pulse with the contrast of the hologram being a measure of the amplitude of the modulated pulse.

* * * * *